United States Patent [19]
Kokune et al.

[11] Patent Number: 5,603,762
[45] Date of Patent: Feb. 18, 1997

[54] PROCESS AND APPARATUS FOR THE PRODUCTION OF FILMS OF OXIDE TYPE SINGLE CRYSTAL

[75] Inventors: Nobuyuki Kokune; Kazuaki Yamaguchi, both of Nagoya; Shoji Sogo, Komaki; Ryuichi Ohuchi, Nagoya; Tatsuo Kawaguchi, Nagoya; Minoru Imaeda, Nagoya, all of Japan

[73] Assignee: NGK Insulators, Ltd., Japan

[21] Appl. No.: 441,920

[22] Filed: May 16, 1995

[30] Foreign Application Priority Data

May 31, 1994 [JP] Japan .................................. 6-118093

[51] Int. Cl.$^6$ .............................................. C30B 19/06
[52] U.S. Cl. ............................ 117/60; 117/58; 117/948
[58] Field of Search .............................. 117/58, 60, 948; 118/501

[56] References Cited

U.S. PATENT DOCUMENTS

| | | | |
|---|---|---|---|
| 3,647,578 | 3/1972 | Barnett et al. | 117/58 |
| 3,994,755 | 11/1976 | Kamath et al. | 117/60 |
| 4,092,208 | 5/1978 | Brice et al. | 117/60 |

FOREIGN PATENT DOCUMENTS

| | | | |
|---|---|---|---|
| 2413325 | 10/1975 | Germany | 117/60 |
| 57-206012 | 12/1982 | Japan | H01F 41/28 |
| 59-181012 | 10/1984 | Japan | 117/60 |
| 61-31385 | 2/1986 | Japan | 117/60 |
| 2-88430 | 3/1990 | Japan | C01G 49/00 |
| 2-259608 | 10/1990 | Japan | G02B 6/12 |
| 5-117096 | 5/1993 | Japan | C30B 29/30 |
| 6-56573 | 3/1994 | Japan | 117/60 |

OTHER PUBLICATIONS

Applied Physics Letters, vol. 26, No. 1, Jan. 1, 1975, pp. 8–10, "Optical waveguide of $LiNbO_3$ thin grown by liquid phase epitaxy".

J. Appl. Phys. 70 (5), Sep. 1, 1991, pp. 2536–2541, "$LiNbO_3$ thin-film optical waveguide grown by liquid phase epitaxy and its application to second-harmonic generation".

Journal of Crystal Growth 132 (1993) pp. 48–60, "Liquid phase epitaxial growth of $LiNbO_3$ thin film using $Li_2O$–$B_2O_3$ flux system".

*Primary Examiner*—Robert Kunemund
*Attorney, Agent, or Firm*—Parkhurst, Wendel & Burr, L.L.P.

[57] ABSTRACT

A process is disclosed for producing a film of an oxide type single crystal on a substrate of such an oxide type single crystal by epitaxially growing the oxide type single crystal on the substrate through contacting the substrate onto a melt in an overcooled state. The substrate of the oxide type single crystal is contacted with the melt held in a first furnace, and the substrate of the oxide type single crystal is held inside a second furnace separated from said first furnace, and the temperature of the substrate is adjusted in the second furnace. An oxide type single crystal film-producing apparatus is also disclosed.

20 Claims, 13 Drawing Sheets

FIG._5

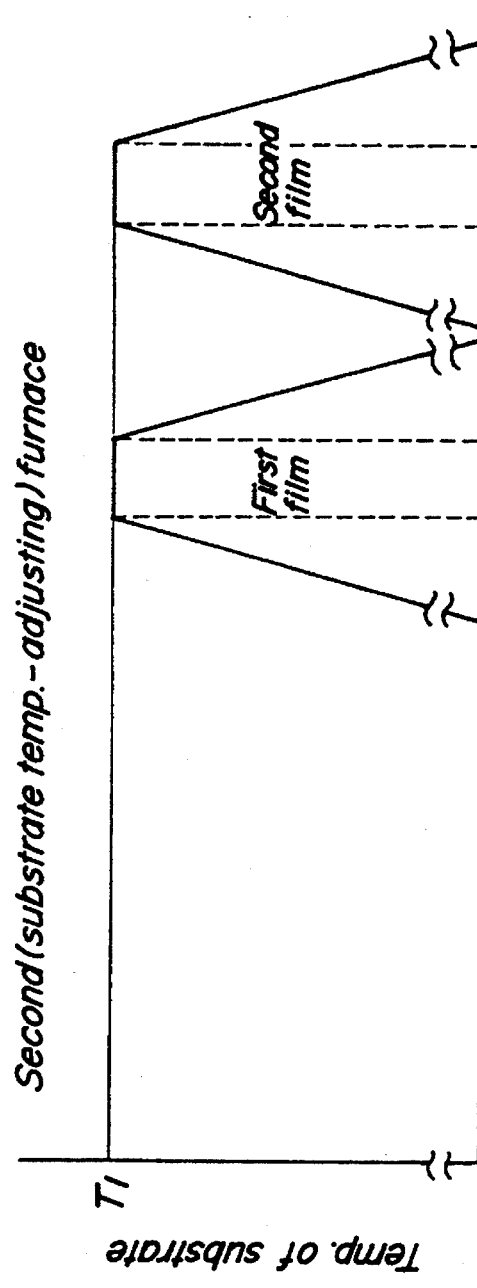
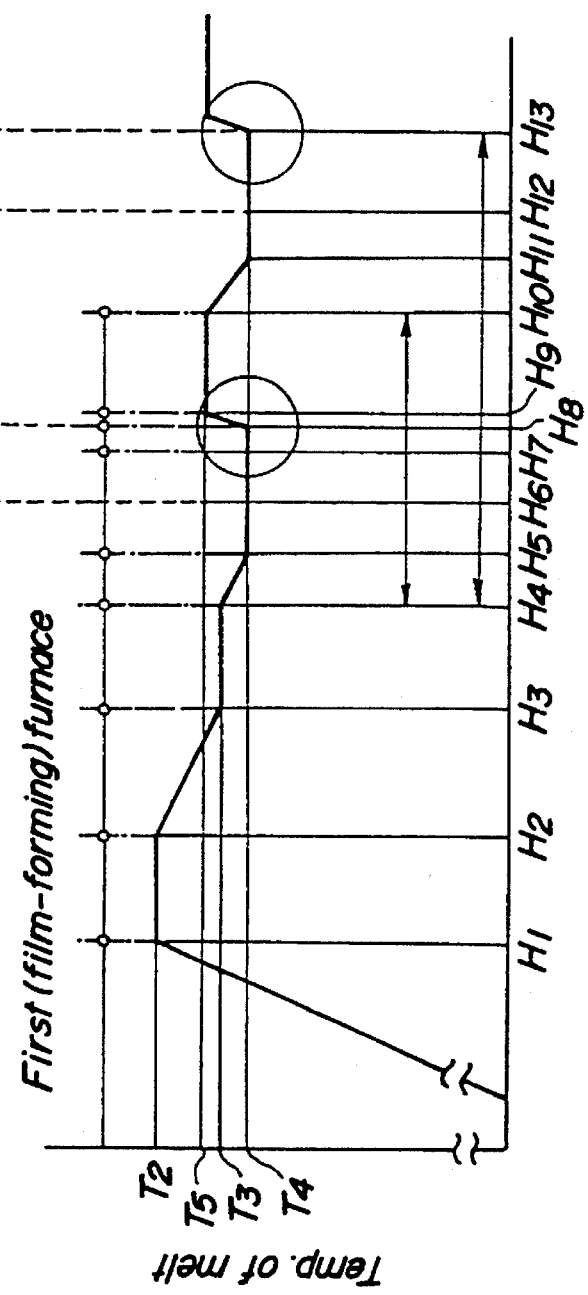
FIG.7b
FIG.7a

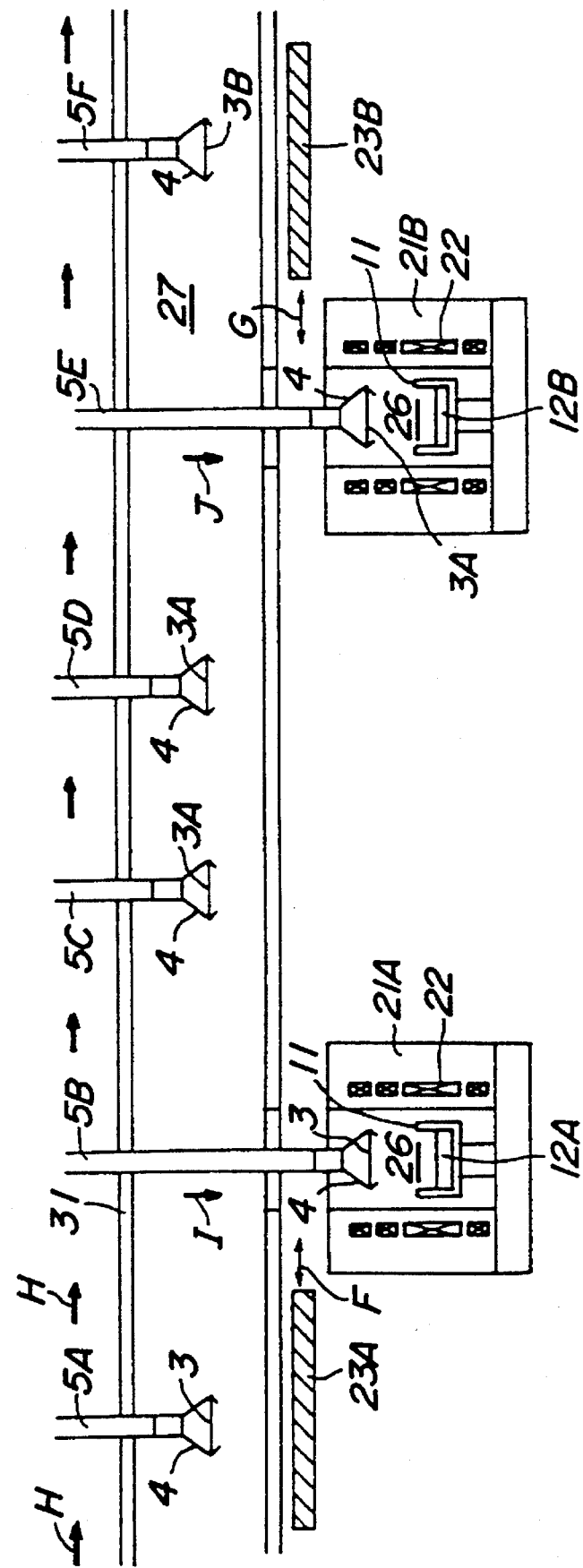

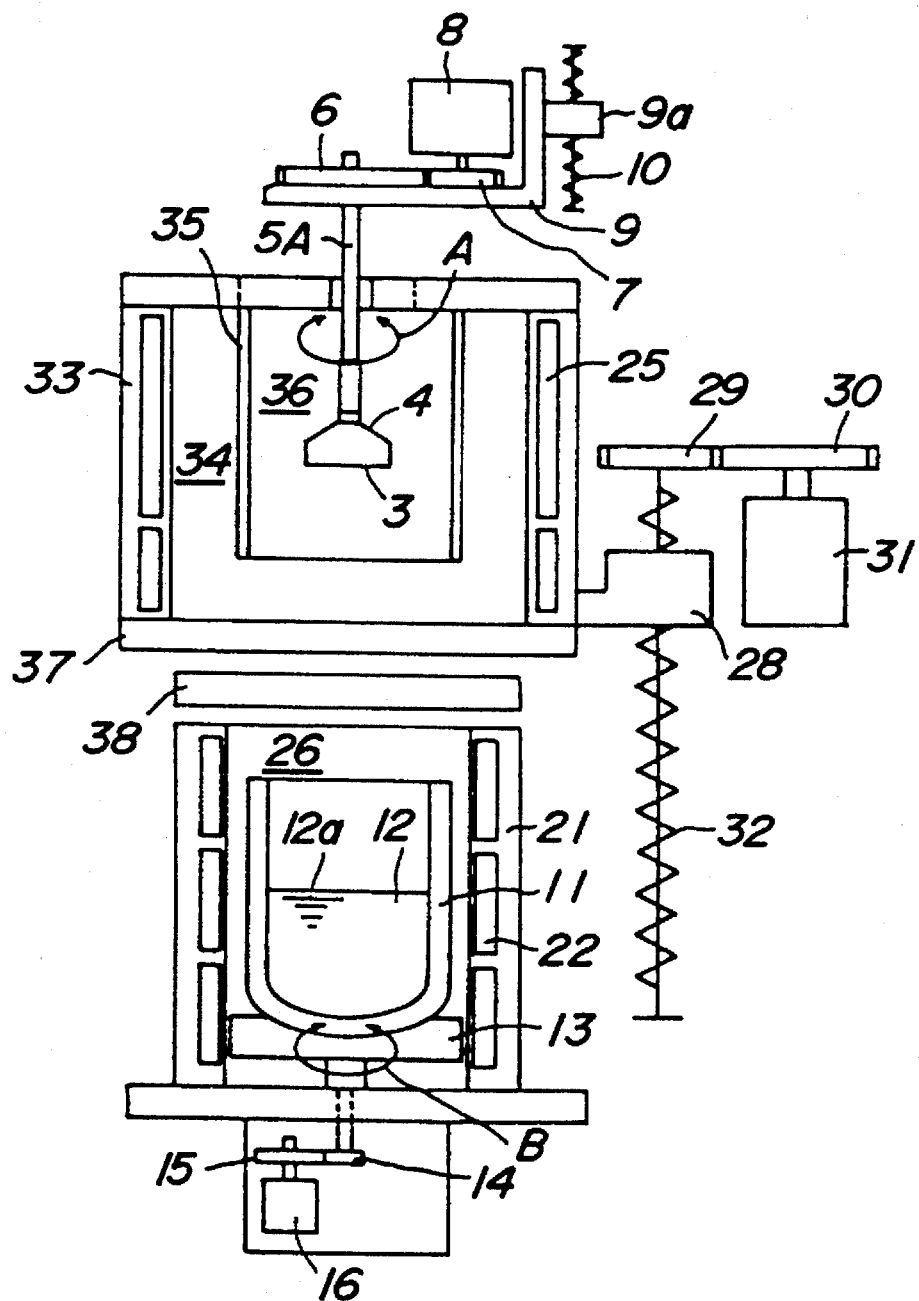
FIG_12

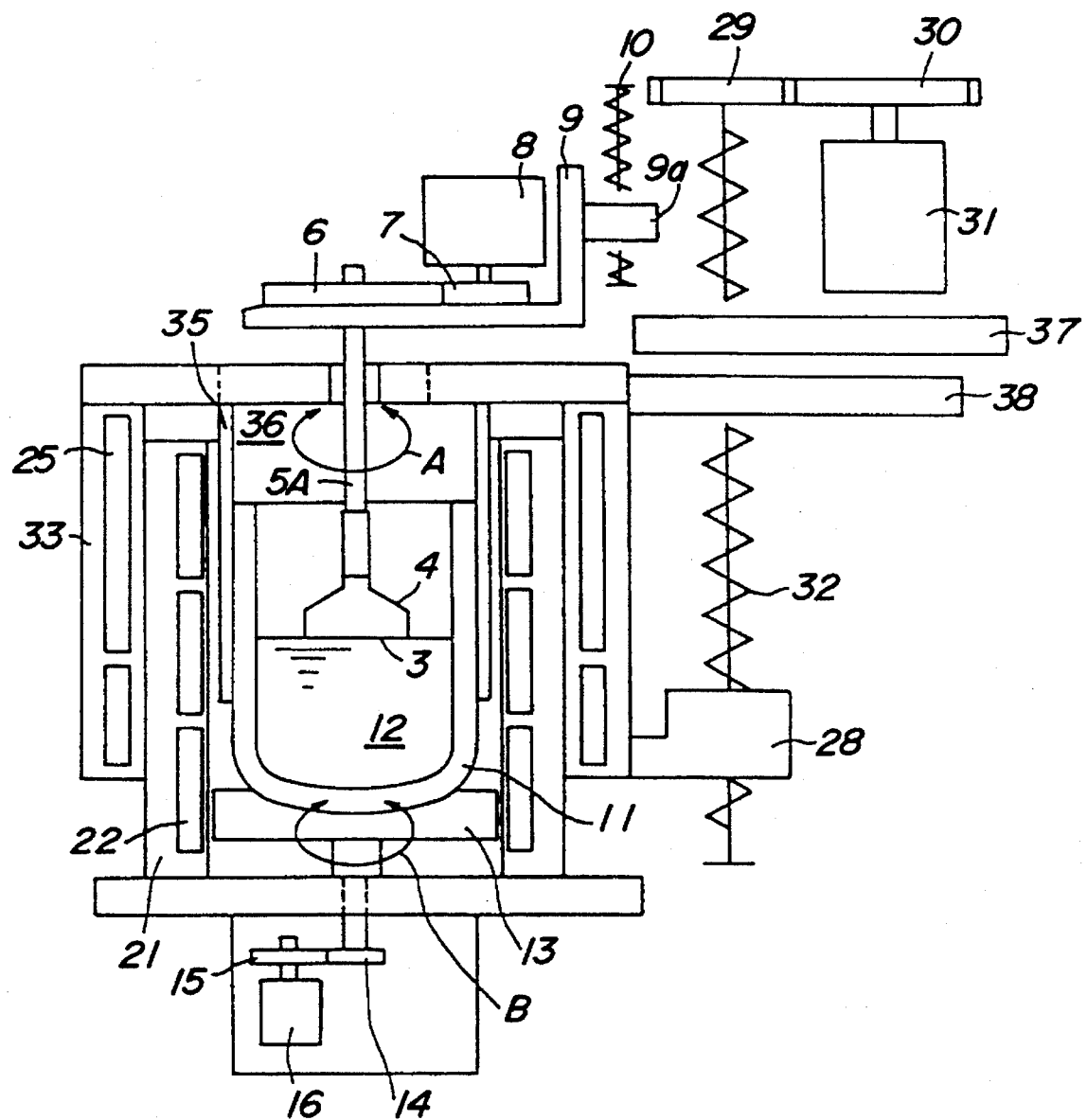
FIG_13

PROCESS AND APPARATUS FOR THE PRODUCTION OF FILMS OF OXIDE TYPE SINGLE CRYSTAL

BACKGROUND OF THE INVENTION (1) Field of the Invention

The present invention relates to a method and apparatus for mass-producing high quality oxide type single crystal films by a liquid phase epitaxial process.

(2) Related Art Statement

A single crystal of lithium niobate ($LiNbO_3$) and a single crystal of lithium tantalate have been expected as optoelectronic materials. It is known that a thin film of lithium niobate may be formed on a substrate made of a lithium niobate single crystal or the like by the liquid phase epitaxial process. For instance, according to "Appl. Phys. Letters", Vol 26, No. 1 (1975), pp 8–10, a thin film of a lithium niobate single crystal having an almost stoichiometric composition (Li/Nb=1) is formed on a substrate of a lithium tantalate single crystal. According to "J. Appln. Phys.", Vol. 70, No. 5 (1991), pp 2536–2541, a thin film of a lithium niobate single crystal is prepared on a substrate of lithium niobate doped with 5 mol % magnesium oxide by the liquid phase epitaxial process, while a lattice constant is varied by changing a ratio of $Li_2O/Nb_2O_5$ of a melt. According to "J. Cryst. Growth", Vol 132 (1993), pp 48–60, a thin film of a lithium niobate single crystal having an almost stoichiometric composition is formed on a substrate of lithium niobate doped with 5 mol % magnesium oxide by the liquid phase epitaxial process. Further, according to Japanese patent application Laid-open No. 5-117,096, a thin film of a lithium niobate single crystal having a composition of Li/Nb=1 is formed by the liquid phase epitaxial process.

The film-forming process in the liquid phase epitaxial technique will be schematically explained with reference to a temperature schedule in FIG. 1. First, for example, lithium niobate (solute) and $LiVO_3$ (melting medium) are charged and mixed together. At that time, the mixture is at room temperature. After the mixture is heated in a furnace, a melt-stirring rod is inserted into the mixture, so that the melt inside a crucible is stirred and fully fused (temperature: $t_1$, time period: $h_1$–$h_2$). The temperature of the melt is lowered slightly from $t_1$ to $t_2$ (time period: $h_2$–$h_3$), and kept at this temperature $t_2$ higher than a saturation temperature to uniformly melt lithium niobate and $LiVO_3$ (time period: $h_3$–$h_4$). The saturation temperature of the melt is determined by the charged composition of the solute and the solvent. Then, the melt is cooled to a temperature $t_3$ lower than the saturation temperature (time period: $h_4$–$h_5$) to keep the melt in a overcooled (supercooled) state (time period: $h_5$–$h_6$). A substrate is contacted with the melt in the overcooled state, so that a film of a lithium niobate single crystal is grown by the liquid epitaxial process. Then, the temperature of the melt is lowered to room temperature (time period: $h_6$–$h_7$).

An experiment for the production of a film of a single crystal of lithium niobate was carried out by using a conventional producing apparatus schematically shown in FIG. 2. That is, a heater 2 was buried in a wall of a furnace 1, and a crucible 11 was placed in the furnace 1. A melt 12 was charged into a crucible 11, and the crucible 11 was fixed on a table 13. A rotary shaft 5 was inserted through an opening 17 formed in an upper portion of the furnace 1, and a holding section 4 made of platinum was provided at a lower end of the rotary shaft 5. A substrate 3 of a lithium niobate single crystal was held by the holding section 4. The holding section 4 and the substrate 3 were rotated via the rotary shaft 5 and gears 6, 7 by driving a motor 8 in a direction of an arrow A. The gears 6, 7 and the motor 8 were attached onto an arm 9, and a projection 9a of the arm 9 was fitted to a lifter 10. First, a raw mixture was placed in the crucible 11, and heated inside the furnace. A stirring shaft (not shown) was descended to insert its tip into the crucible 11. The shaft was rotated, and the mixture was melted under stirring (temperature $t_1$). Then, the stirring shaft was pulled up out of the furnace 1, and the melt was converted to an overcooled state. On the other hand, the rotary shaft 5 was gradually descended to make the substrate 3 contact with the melt in the overcooled state.

However, having examined this producing process, the present inventors have found the following problems. That is, in order to contact the substrate 3 of a lithium niobate single crystal with the melt 12, it is necessary to gradually descend the substrate at room temperature and contact it with the melt 12 in the overcooled state. However, it was frequently found that the lithium niobate single crystal substrate 3 was cracked or the crystallinity of the single crystal film was deteriorated.

Having examined causes for the above problems, the present inventors have reached the following conclusion. That is, since the melt 12 is ordinarily at a high temperature not less than 900° C., there occurs a temperature gradient inside the furnace 1 that the temperature of the melt is higher at a lower portion. In addition, since the substrate 3 is almost horizontally held, the temperature of an under face of the substrate 3 becomes higher by heat radiation as the substrate is descended. In particular, since the substrate of an oxide type single crystal such as a lithium niobate single crystal has low heat conductivity, a relatively large temperature difference is likely to occur between the upper face and the lower face of the substrate 3. As a result, the substrate 3 was likely to be cracked due to difference in thermal expansion. In addition, since the lithium niobate is ferrodielectric, pyroelectricity is likely to occur due to this temperature difference, so that such a single crystal was greatly cracked by this pyroelectricity.

In order to prevent the above cracking of the substrate 3, the temperature difference between the upper face and the lower face of the substrate 3 may be reduced by decreasing the descending speed of the substrate 3. However, if a time period of descending the substrate 3 is prolonged, the time necessary for the formation of the single crystal film is extremely long so that productivity of the single crystal film largely drops. In addition, if the substrate-descending speed is remarkably reduced, the substrate was unlikely to be cracked. However, the crystallinity of the single crystal film was deteriorated. This is considered to occur due to the difference in thermal expansion and pyroelectrocity. The above problem similarly occurred when the substrate of the oxide type single crystal substrate was pulled up in the furnace after contacting the melt.

SUMMARY OF THE INVENTION

The present invention is directed to the formation of a film of an oxide type single crystal on a substrate of such an oxide type single crystal, and is aimed at the prevention of cracking of the substrate, enhancement of productivity of the film of the oxide type single crystal, and improvement of the crystallinity of the oxide type single crystal film.

For realizing the above object, a producing process according to the present invention is directed to the growing of a film of an oxide type single crystal on a substrate of such an oxide type single crystal by epitaxially growing the oxide type single crystal film on the substrate through contacting the substrate onto a melt in an overcooled state, and characterized in that the substrate of the oxide type single crystal is contacted with the melt held in a first furnace, the substrate of the oxide type single crystal is held inside a second furnace separated from said first furnace, and the temperature of the substrate is adjusted in the second furnace.

On the other hand, an oxide type single crystal film-producing apparatus according to the present invention is adapted for producing a film of an oxide type single crystal on a substrate of such an oxide type single crystal by epitaxially growing the oxide type single crystal film on the substrate through contacting the substrate onto a melt in an overcooled state, said apparatus including a first furnace in which the melt is held and said substrate of the oxide type single crystal is contacted with the melt; a second furnace separated from the first furnace and adapted for holding and adjusting the temperature of the substrate of the oxide type single crystal; and a moving unit for moving said substrate between the first furnace and the second furnace.

According to the present invention, the second furnace is provided separately from the first furnace, and the temperature of the substrate of the oxide type single crystal is adjusted inside the second furnace. In the prior art, the substrate of the oxide type single crystal is descended from room temperature to the high temperature melt inside the furnace, whereas according to the present invention, before or after the oxide type single crystal substrate contacts the melt inside the first furnace, the substrate is placed in the separate furnace where the temperature of the substrate can be adjusted. Therefore, since difference in temperature among various locations of the substrate is unlikely to occur as mentioned above, cracking of the substrate can be prevented, and the crystallinity of the oxide type single crystal film can be improved. In addition, since almost no difference in temperature occurs in the substrate inside the second furnace, the substrate will not be cracked even if the heating rate and the cooling rate for the substrate are made greater as compared with the prior art. Therefore, productivity of the oxide type single crystal film can be enhanced.

These and other objects, features and advantages of the invention will be appreciated upon reading the following description of the invention when taken in connection with the attached drawings, with the understanding that some modifications, variations and changes of the same could be easily made by the skilled person in the art to which the invention pertains.

BRIEF DESCRIPTION OF THE ATTACHED DRAWINGS

For a better understanding of the invention, reference is made to the attached drawings, wherein.

Figure 4:
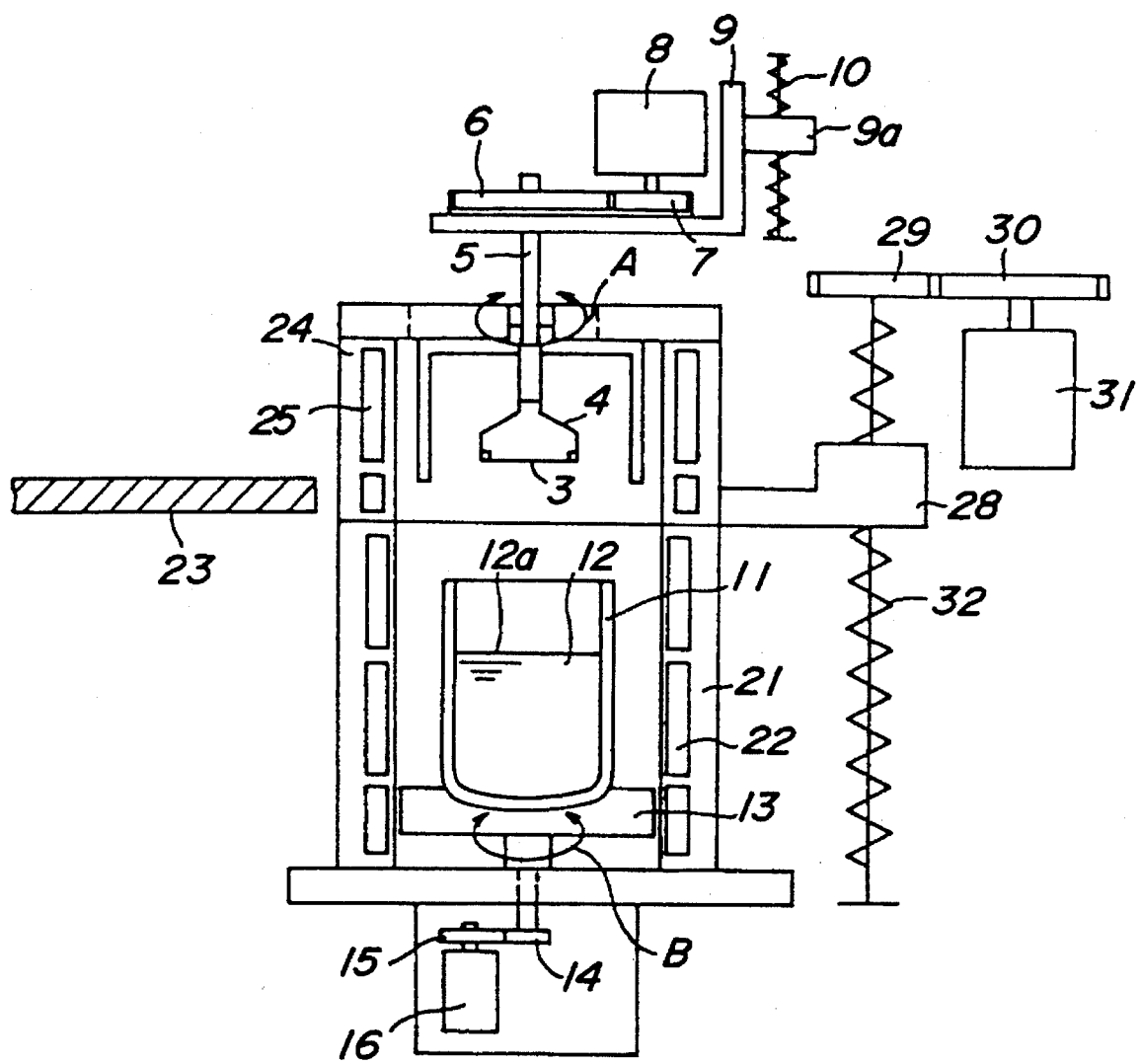
Figure 5:
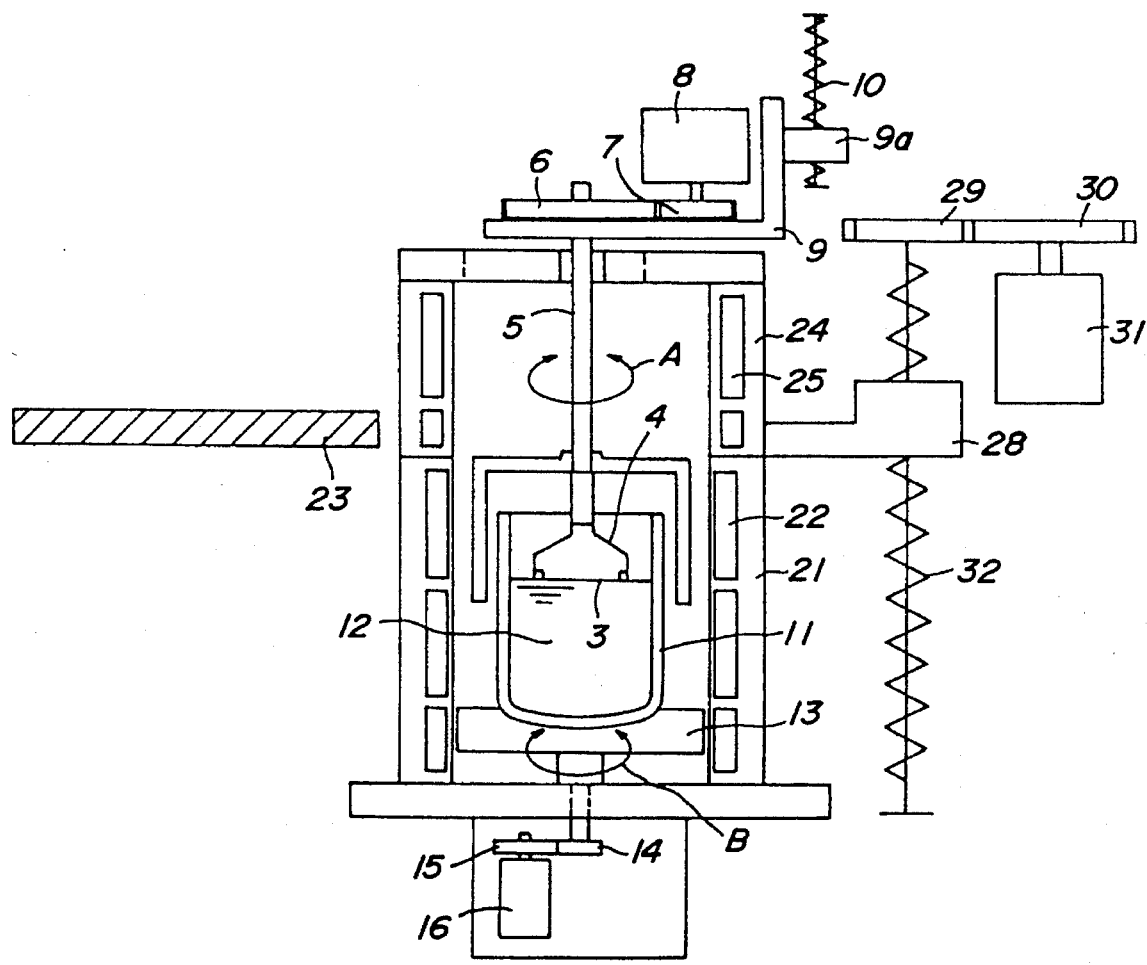
Figure 6:
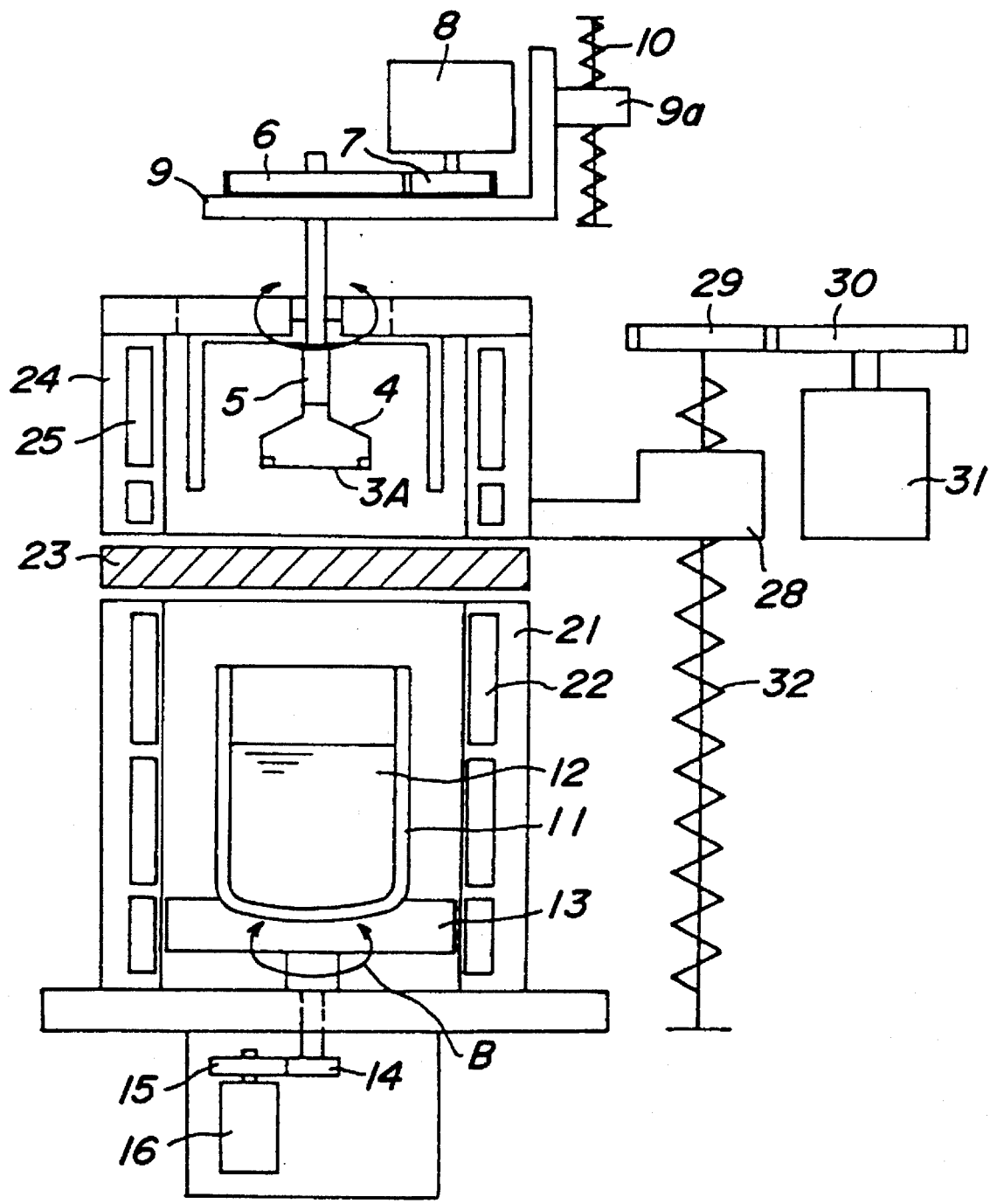
Figure 8:
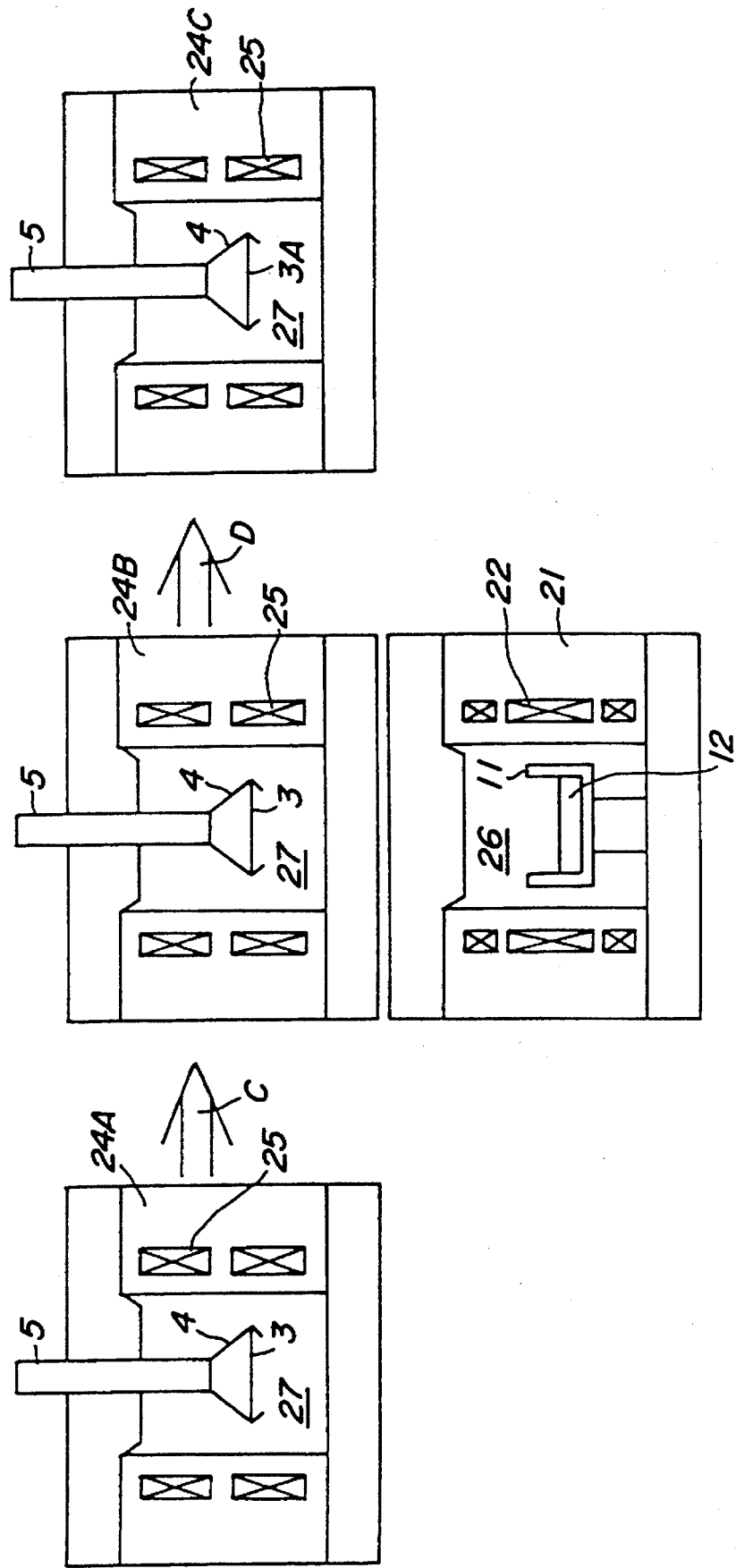
Figure 9:
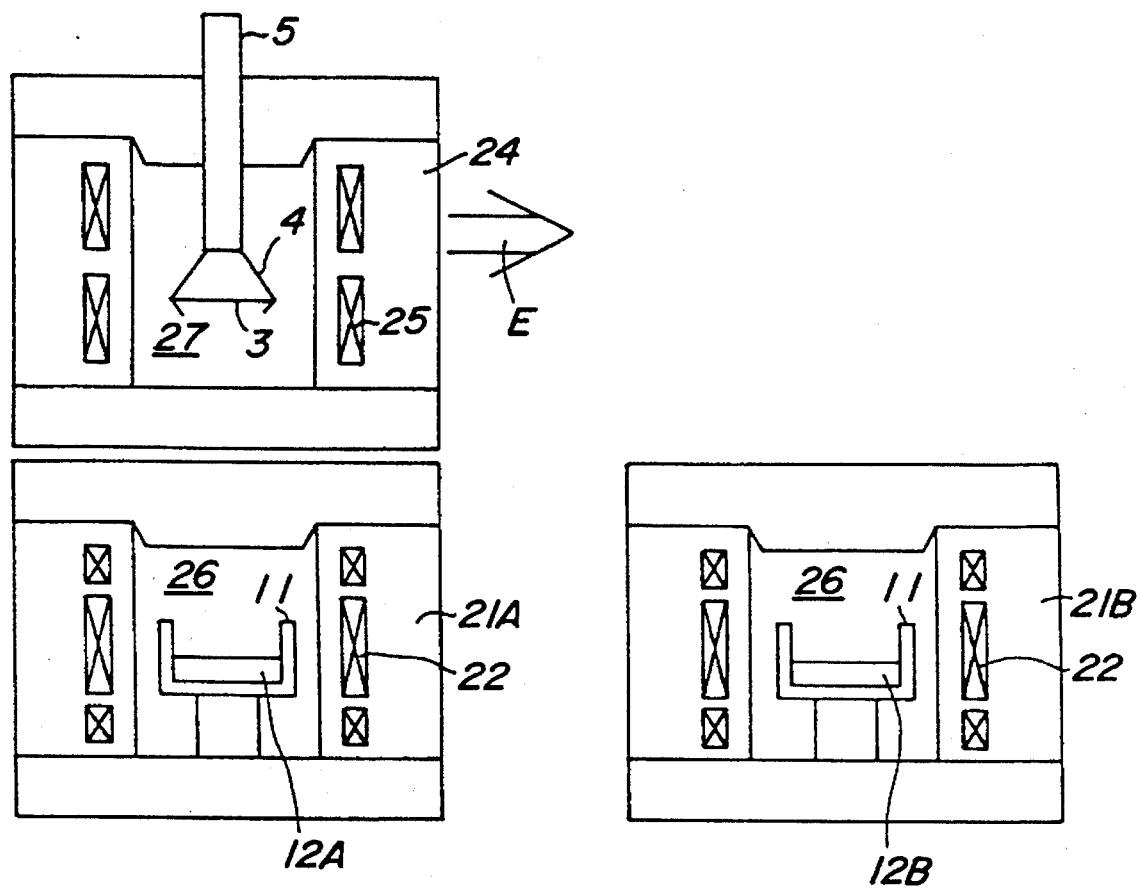
Figure 10:
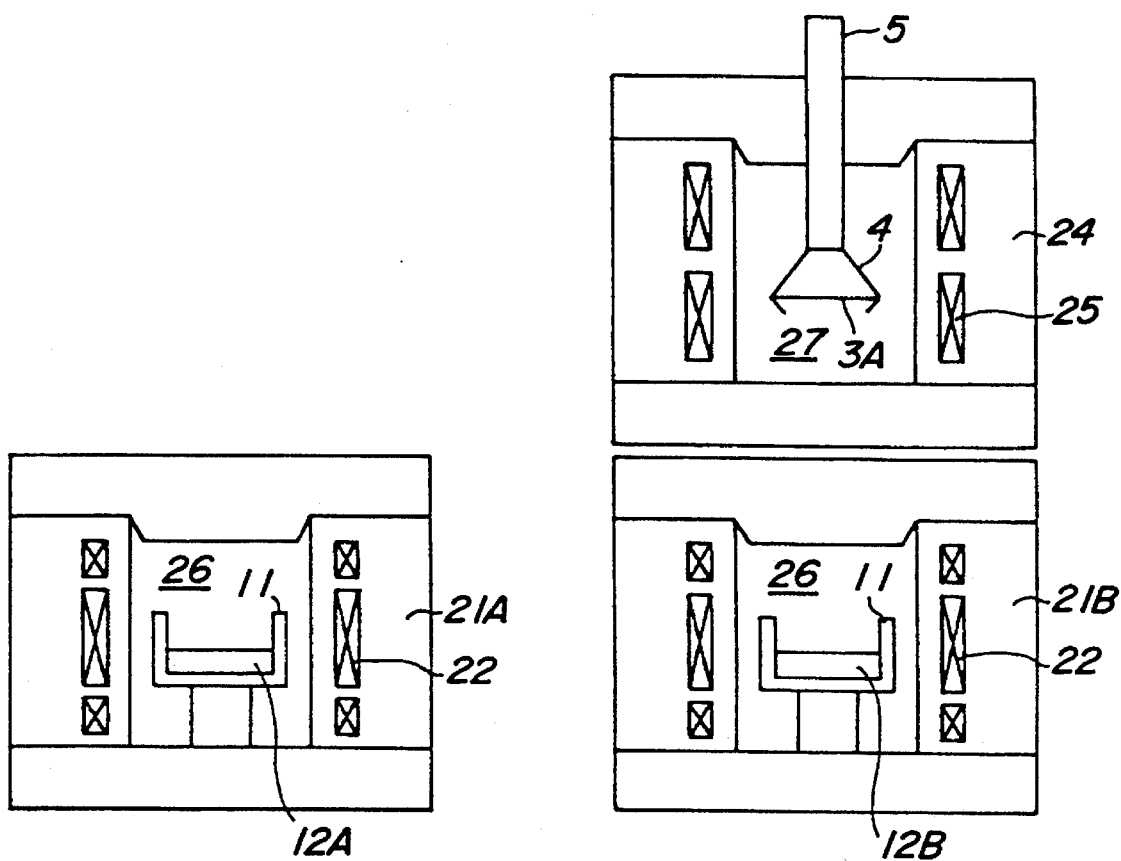

FIG. 4 is a diagrammatical view for illustrating the producing apparatus as the embodiment of the present invention in the state that the interior of the first furnace 21 is communicated with that of the second furnace 24 by removing an shield plate 23;

FIG. 5 is a diagrammatical view for illustrating the producing apparatus as the embodiment of the present invention in which a substrate 3 of an oxide type single crystal is contacted with a melt 12;

FIG. 6 is a a diagrammatical view for illustrating the producing apparatus as the embodiment of the present invention in which the oxide type single crystal substrate 3A upon which a single crystal film is formed is pulled up into the second furnace 24;

FIGS. 7(a) and 7(b) are graphs for showing preferred temperature schedules in the first furnace 21 and the second furnace 24 in the producing apparatus in FIGS. 3 to 6;

FIG. 8 is a diagrammatical view for illustrating another embodiment of the producing apparatus according to the present invention;

FIG. 9 is a diagrammatical view for illustrating a further embodiment of the producing apparatus according to the present invention;

FIG. 10 is a diagrammatical view for schematically illustrating the producing apparatus shown in FIG. 9 in the state that a second furnace 24 is moved above a first furnace 21B;

FIG. 11 is a diagrammatical view for illustrating another producing apparatus in which a tunnel furnace is used as a second furnace;

FIG. 12 is a diagrammatical view of a still further embodiment of the producing apparatus according to the present invention in which a first furnace 21 may be accommodated in a second furnace 33; and FIG. 13 is a diagrammatical view for schematically illustrating the producing apparatus of FIG. 12 in the state that a second furnace is descended.

DESCRIPTION OF THE PREFERRED EMBODIMENTS

In the following, preferred embodiments of the present invention will be explained together with their functions and/or effects.

(1) According to the present invention, the oxide type single crystal substrate is heated inside the second furnace separately provided from the first furnace, and then the substrate is moved into the first furnace. In this case, since the temperature of the substrate is adjusted by preliminarily heating the substrate before the substrate is placed into the first furnace, the difference in temperature inside the substrate is unlikely to occur when the substrate is moved, and particularly descended in the first furnace. For this purpose, the difference in temperature between the melt and the substrate is set preferably at not more than 200° C., more preferably at not more than 100° C. In this case, it is possible that the oxide type single crystal substrate is heated in the second furnace, then the first and second furnaces are communicated together, and thereafter the substrate is moved into the first furnace. As compared with a case where the oxide type single crystal substrate is taken out from the first and second furnaces and then moved into the first furnace, heat impact is less likely to be applied upon the oxide type single crystal substrate, and the crystallinity of the single crystal film is unlikely to be deteriorated.

(2) Further, according to the present invention, the substrate of the oxide type single crystal is contacted with the melt in the first furnace, the resulting oxide type single crystal substrate is moved from the first furnace to the second furnace, and the substrate is cooled in the second furnace. In this case, since the substrate is moved from the first furnace to the second furnace held at a high temperature, almost no difference in temperature occurs in the second furnace. Thus, it is possible that the oxide type single crystal substrate is contacted with the melt in the first furnace, then the first and second furnaces are communicated with each other, and thereafter the oxide type single crystal substrate is moved into the second furnace. By so doing, similar effects as in the above (1) can be obtained.

(3) In a so-called horizontal dipping process in which a film of the oxide type single crystal is formed on a main face of the oxide type single crystal substrate by contacting this main face with the melt, difference in temperature between upper and lower faces of the substrate is likely to become particularly large, because the substrate is almost horizontally held and heat from the melt is intercepted by the substrate itself. Therefore, the producing process according to the present invention is especially useful for this process. However, needless to say, the fundamental effects of the present invention can be exhibited even when the invention process is applied to other substrate-holding techniques.

(4) The melt is held in an unsaturated state in the first furnace; this melt is converted to an overcooled state by lowering the temperature of the melt; the film of the oxide type single crystal is formed on the substrate by contacting the substrate to the melt in the overcooled state; the resulting substrate is moved from the first furnace to the second furnace, whereas the melt is converted to the unsaturated state again by raising the temperature of the melt; then the melt is converted to the overcooled state again by lowering the temperature of the melt; a film of the oxide type single crystal is formed on another substrate of an oxide type single crystal by contacting said substrate with the melt in the overcooled state.

When the temperature of the melt is continuously varied between the unsaturated state and the overcooled state as mentioned above, the temperature of the melt needs not be lowered to room temperature. Accordingly, the mass production of the oxide type single crystal films can be more easily effected.

(5) According to the present invention, the melt is placed in the first furnace, and utilized for the liquid phase epitaxial growth in the liquid phase. Thus, the film-producing efficiency in the first furnace acts as an upper limit for the productivity of the entire film. In view of this, it is preferable that a plurality of second furnaces are prepared for one first furnace; while the film of the oxide type single crystal is being formed on the substrate of the oxide type single crystal by contacting the substrate with the melt in the first furnace, another substrate of an oxide single crystal is heated in one of the second furnaces and a further substrate of an oxide type single crystal upon which a film of the oxide type single crystal has been formed is cooled in other second furnace. By so doing, the stop time period of the first furnace can be remarkably shortened.

(6) A plurality of first furnaces are used for holding respective melts; and the substrate of the oxide type single crystal is successively contacted with the melts in first furnaces, thereby successively laminating films of the oxide type single crystals on the substrate of the oxide type single crystal. In this case, a laminate of the oxide type single crystal films can be easily mass produced.

Particularly, if the melts in the respective first furnaces are of the same kind, a thick oxide type single crystal film can be easily produced. Further, if the melts in the respective first furnaces differ from each other, films of different oxide type single crystals can be successively formed on the substrate.

(7) In the present invention, it is possible that said second furnace is a tunnel furnace having a given temperature schedule in a length direction; the temperature of the substrate of the oxide type single crystal is adjusted, while being transferred in the tunnel furnace; and the substrate is contacted with the melt in each of the first furnaces. By so doing, the stop time of the first furnaces can be shortened to the utmost. Further, since a plurality of the first furnaces are connected to one tunnel furnace, a laminate of oxide type single crystal films can be easily mass produced.

(8) The substrate of the oxide type single crystal may be made of a ferroelectric substance. In this case, since the influence of pyroelectricity is greater, the effects aimed at by the present invention become more conspicuous.

(9) The oxide type single crystal film-forming apparatus includes a movable partition wall for separating the first and second furnaces, and a driving unit for moving the first and second partition walls relative to each other, wherein the temperature of the substrate of the oxide type single crystal is adjusted in the state that the first furnace is isolated from the second furnace by the partition wall, and the first and second furnaces are communicated with each other by moving the partition wall and moving first and second furnaces relative to each other. In this case, the first and second furnaces can be effectively isolated from or communicated with respect to each other, and the entire apparatus can be made more compact.

(10) The apparatus includes a movable partition wall for separating the first and second furnaces, and a driving unit for moving the first and second furnaces relative to each other, wherein the temperature of the substrate of the oxide type single crystal is adjusted in the state that the second furnace is isolated from the first furnace, and the first furnace can be moved and received the second furnace and said substrate is movable into the first furnace, when the partition wall is moved and the first and second furnaces are moved relative to each other. In this case, the following effects can be obtained. That is, when the substrate is placed in the first furnace, the dimension of the entire furnace assembly can be reduced to make the apparatus more compact when the first furnace can be accommodated in the second furnace, as compared with a case where the first and second furnaces are communicated with each other without the first furnace being accommodated into the second one. In the above, the first furnace is accommodated in the second one, the latter may be accommodated into the furnace with some appropriate design change.

In addition, since the furnace can be made compact as stated above, when the substrate held by the rotary shaft is descended into the first furnace, the rotary shaft can be shortened. After the single crystal film is formed on the substrate by contacting the substrate with the melt, the excess melt needs to be peeled off by rotating the substrate at a high speed. Since this rotating speed is around a few to several hundred turns per minutes. Therefore, the shorter the rotary shaft, the more stabilized and less specially vibrated is the rotation.

(11) The oxide type single crystal film-forming apparatus includes a crucible into which the melt is held, said melt being able to be stirred under rotation of said crucible. In the conventional technique, when the raw mixture for the melt is to be melted in the crucible, this mixture is placed in the crucible, the stirring shaft is inserted downwardly into the crucible, the mixture is stirred by the shaft, and the shaft is taken out from the furnace. However, the melt may be placed and then stirred in the crucible, while the crucible is being rotated. In this case, a series of the insertion and removal of the stirring shaft as mentioned above becomes unnecessary, thereby enhancing the productivity.

In the following, more concrete embodiments of the present invention will be explained with reference to the attached drawings. FIGS. 3 through 6 are diagram-matical views illustrating the producing apparatus as one embodiment according to the present invention, which views correspond to respective steps in the present invention. FIG. 7 is a graph showing a preferable timing chart when this apparatus is to be operated.

Figure 3:
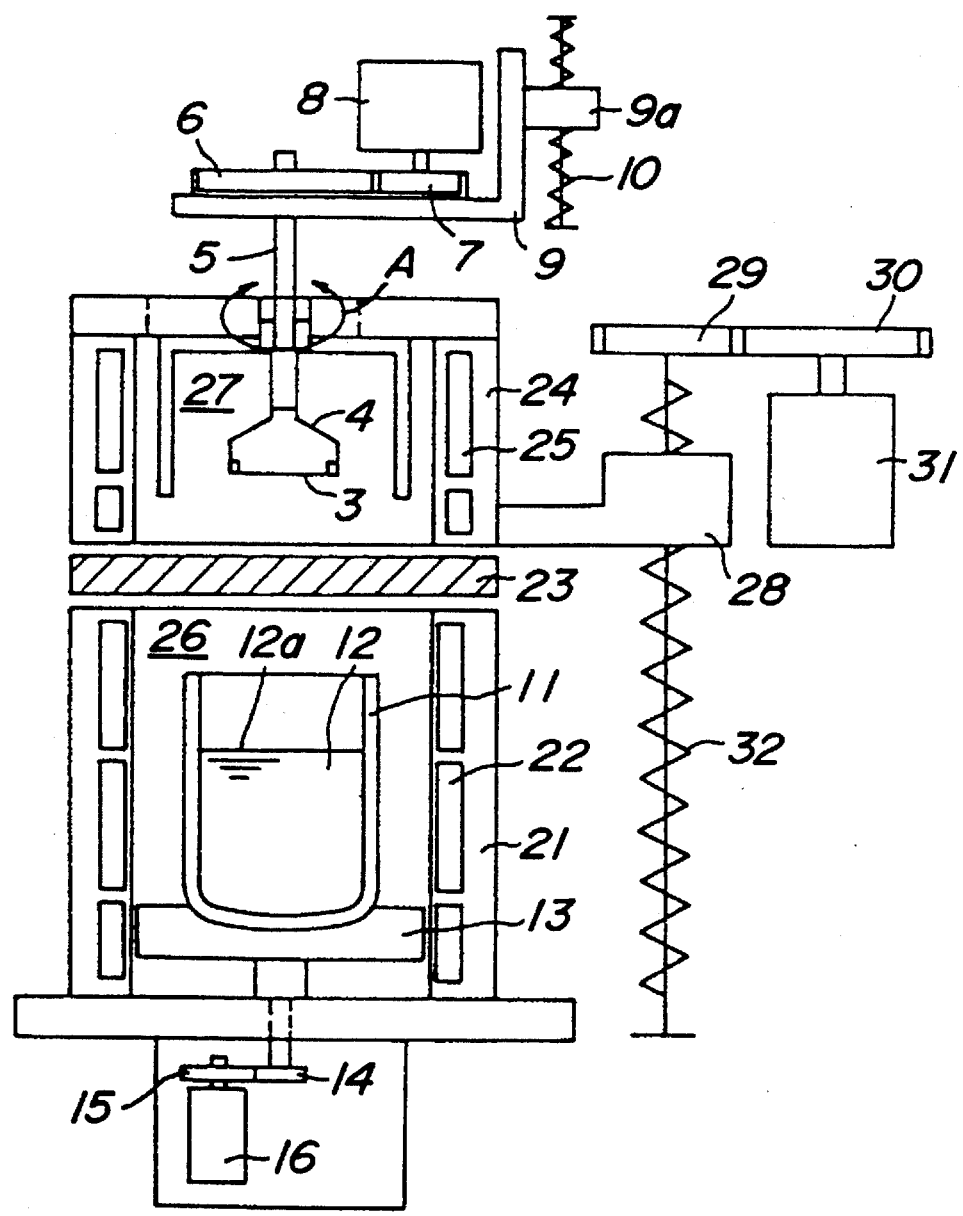
FIG. 3 is a diagrammatical view for illustrating a producing apparatus as one embodiment of the present invention in which an interior of a first furnace 21 is separated from that of a second furnace 24.

First, as shown in FIG. 3, a first furnace 21 and a second furnace 24 are provided separately. A heater 22 is buried in a wall of the first furnace 21, and a crucible 11 is arranged in the first furnace 21. A melt 12 is charged into a crucible 11, which is fixed onto the table 13. The table 13 is rotated via gears 14 and 15 by driving a motor 16, so that the melt is stirred inside the crucible.

The second furnace 24 is arranged above the first furnace 21, and the interior 26 of the first furnace 21 is separated from that 27 of the second furnace 24 by means of a shield plate 23. A heater 25 is buried in a wall of the second furnace 24, and a rotary shaft 5 is inserted through a through-hole provided in an upper portion of the second furnace 24. A holding section 4 made of such as platinum is provided at a lower end of the rotary shaft 5, and a substrate 3 of an oxide type single crystal is supported by the holding section 4. When a motor 8 is driven, the holding section 4 and the substrate 3 are rotated via gears 6 and 7 and the rotary shaft 5 in a direction shown by an arrow A. A unit for moving the second furnace includes the gears 6, 7, the motor 8, an arm to which the gears 6, 7 and the motor 9 are fitted, a lifter mechanism such as a feeding screw 10 to which a projection 9a of the arm is fitted.

To the second furnace 24 is fitted a lifter element 28, which is engaged around a feed screw 32. When a motor 31 is driven, a gear 30, 29, and a feed screw 32 are rotated to ascend or descend the lifter element 28.

First, a given material is charged into a crucible 11, and is melted by raising the temperature in the first furnace 21 up to $T_2$ in FIG. 7(a) (point of time: $H_1$). In this state, the melt is kept at $T_2$ up to a point of time: $H_2$. Next, the melt is cooled to a temperature of $T_3$ during a time period of $H_2$ to $H_3$. Then, the melt is held at this temperature $T_3$ during a time period of $H_3$ to $H_4$.

Thereafter, the temperature of the melt is lowered to $T_4$ during a time period of $H_4$–$H_5$, so that the liquid phase is converted to an overcooled state. The temperature $T_4$ is slightly lower than a saturation temperature of a charged composition for the melt. The "saturation temperature" means a temperature at which a solute is saturated in the melt resulting from the charged composition or mixture. When the melt is kept at this temperature $T_4$ for a given temperature, a solid phase comes out in the melt, so that the solid phase and the liquid phase coexist. By implementing this step, the quality, particularly the viscosity, of the liquid phase can be automatically kept in a constant state.

On the other hand, the substrate 3 of the oxide type single crystal is heated in the second furnace 24 to raise its temperature up to $T_1$ (point of time: $H_6$). At this time, what is to be noted is that the temperature distribution in the interior 27 of the second furnace 24 is almost uniform, and no temperature gradient exists unlike in the conventional first furnace. Therefore, substantially no temperature difference occurs in the substrate 3 of the oxide type single crystal inside the second furnace 24. In addition, although the substrate 3 has very low resistance against cracking due to internal temperature difference, it has durability against merely thermal impact. Therefore, even if the heating rate is increased, no adverse effect will occur with respect to the substrate 3.

Next, as shown in FIG. 4, the shield plate 23 is moved to communicate the interior of the first furnace 21 with that of the second furnace 24. Then, as shown in FIG. 5, the substrate 3 is descended, while being rotated in a direction shown by the arrow A. When the time reaches a point of time $H_7$, the temperature of the melt is further lowered from $T_4$ to a given temperature. This reduction in temperature is an overcooled degree, and preferably 5° to 20° C. Simultaneously, the substrate is contacted with the liquid surface 12a of the melt 12. The substrate is pulled up from the melt at the point of time $H_8$, and as shown in FIG. 6, the substrate is moved again into the second furnace 24. Then, the shield plate 23 is moved to isolate the interior of the first furnace 21 from that of the second furnace 24. The temperature of the melt is raised to $T_5$ during a time period of $H_8$–$H_9$, and the melt is held at $T_5$ for a time period of $H_9$–$H_{10}$. From the second furnace is taken out only the thus treated substrate 3A. Thereafter, a second substrate 3 is subjected to the above-mentioned treatment over a time period of $H_{11}$–$H_{13}$.

In the above, the solid phase is precipitated by holding the melt at the temperature $T_4$, and the state of the liquid phase is determined by $T_4$. This is true even after a number of substrates are continuously treated. Since the overcooled state of the liquid phase is constant in treating a number of the substrates, films of the single crystals each having a constant quality can be continuously formed.

FIG. 8 is a diagrammatical view for schematically illustrating another embodiment of the producing apparatus according to the present invention. In FIG. 8 as well as in succeeding FIGS. 9–11, the same constituent members as shown in FIGS. 3–6 are illustrated in a simplified manner. In FIG. 8, a plurality of second furnaces 24A, 24B and 24C (three second furnaces in this embodiments) are provided for one first furnace 21. Among the second furnaces, the interior of the second furnace 24B is communicated with that of the first furnace 21 where a film of an oxide type single crystal is formed on a substrate 3 by contacting the substrate 3 with the melt 12.

During the formation of the single crystal film, another oxide type single crystal substrate 3 is heated in one of the remaining second furnaces, furnace 24A whereas a further substrate 3A upon which a film of the oxide type single crystal has been formed is cooled in the other second furnace 24C. After the cooling of the substrate is terminated in the second furnace 24C, the substrate is transferred to a next step. When the formation of the film on the substrate 3 of the oxide type single crystal inside the second furnace 24B is terminated, the second furnace 24B is moved as shown by an arrow D to cool the substrate 3A. Simultaneously with this, the second furnace 24A in which the heating of the substrate 3 is terminated is moved as shown by an arrow C to be located above the first furnace 21. According to the above-mentioned procedure, the interior of the first furnace 21 is integrally communicated with that of the second furnace 24A.

In a producing apparatus shown in FIG. 9, melts 12A and 12B are held in a plurality of first furnaces 21A and 21B (two first furnaces in this embodiment), respectively. With respect to the first furnace 21A and the second furnace 24, a film of a single crystal is formed onto a substrate 3 from a melt 12A according to the above-mentioned procedure. Then, the second furnace 24 is moved as shown by an arrow E, so that the second furnace 24 is located above the first furnace 21B as shown in FIG. 10. Then, another film of an oxide type single crystal is formed on the film-formed substrate 3A.

In a further embodiment of the producing apparatus according to the present invention shown in FIG. 11, a tunnel furnace 31 having a given temperature schedule in a longitudinal direction is used as a second furnace. Inside the tunnel furnace 31 are vertically arranged rotary shafts 5A, 5B, 5C, 5D, 5E, 5F, .... A non-treated oxide type single crystal substrate 3, a substrate 3A upon which a single crystal film is formed, and a substrate 3B on which single crystal films are laminated are held by rotary shafts, respectively, and continuously carried in an arrow direction H. As a result, the temperature of each of the oxide type single crystal substrates can be controlled, while the substrates are being carried inside the tunnel furnace 31.

A plurality (two in this embodiment) of first furnaces 21A, 21B are arranged under the tunnel furnace 31, and melts 12A and 12B are held in the respective first furnaces 21A and 21B, respectively. A partition wall 23A, 23B is slidably movable between the tunnel furnace 31 and the first furnace 21A, 21B in any one of arrow directions F and G, so that the first furnace 21A, 21B may be separated from or communicated with the tunnel furnace 31.

According to the above-mentioned procedure, the substrate 3, 3A held by the rotary shaft 5B, 5E is descended into the first furnace 21A, 21B as shown by an arrow I, J, so that the substrate is contacted with the melt 12A, 12B to form a film of the oxide type single crystal onto the substrate. Then, the rotary shaft 5B, 5E is ascended, and the shield plate 23A, 23B is moved to interrupt the communication between the furnaces.

FIGS. 12 and 13 show diagrammatical views for schematically illustrating a producing apparatus in which a first furnace can be accommodated inside a second furnace and thereby a substrate is movable into the first furnace. Same reference numerals as in FIGS. 3 through 6 are given to constituent members identical with or similar to those in FIGS. 3 through 6, and their explanation is omitted for some of them.

As shown in FIG. 12, a first furnace 21 is provided separately from a second furnace 33. The second furnace 33 is arranged above the first one 21, and a horizontal dimension of the second furnace 33 is greater than that of the first furnace 21. The interior 26 of the first furnace 21 is isolated from the exterior by means of a shield plate 38, and the interior 34 of the second furnace 33 is isolated from the exterior by means of a shield plate 37.

A heater 25 is buried in a wall of the second furnace 33, and a rotary shaft 5A is inserted through a through-hole provided in an upper portion of the second furnace 33. A cylindrical partition plate 35 is fitted to an upper wall face of the second furnace 33, and the rotary shaft 5A, a substrate-holding section 4 and a substrate 3 are accommodated in an interior 36 of the partition plate 35.

A given material is first charged into a crucible 11 inside the furnace 21, and a melt is produced, while the crucible 11 is rotated as shown by an arrow B. A temperature schedule for the melt is the same as that in the producing apparatus shown in FIGS. 3 through 6. Inside the space 36 of the second furnace 33 is heated the substrate 3 of an oxide type single crystal. Then, the shield plates 37 and 38 are moved by a driving unit (not shown) to open the furnace 21 and 33. Thereafter, the second furnace 33 is descended, an internal shutter (not shown) on a side of the first furnace is opened, and the first furnace 21 is accommodated into the second furnace 33. The above internal shutter is not always necessary. Simultaneously with this, the partition plate 35 enters the first furnace 21.

After the second furnace is descended to a predetermined location as shown in FIG. 13, the rotary shaft 5A is descended while being rotated, so that the substrate 3 is contacted with the melt 12. A that time, the length of the rotary shaft 5A may be shorter that that of the rotary shaft 5 of the producing apparatus shown in FIGS. 3 through 6. After the formation of the single crystal film is terminated, the second furnace is ascended, and the internal shutter on the side of the first furnace is immediately shut. Then, the second furnace is ascended to the predetermined location, and the shield plates 37 and 38 are returned to their original locations to isolate the furnace 21 from the furnace 33.

As the ferroelectric substrate, a substrate made of an optoelectric single crystal is particularly preferably used in the present invention. The opto-electric single crystal substrate is preferably made of one or more kinds of single crystals selected from the group consisting of lithium niobate (LiNbO$_3$) single crystal, lithium tantalate (LiTaO$_3$) single crystal, and LiNb$_x$Ta$_{1-x}$O$_3$ single crystal (0<x<1). The opto-electric single crystal is most preferably made of the lithium niobate.

In this case, the melting medium is preferably made of one or both of LiVO$_3$ and LiBO$_2$. When this melting medium is employed, the charging composition for the melt is preferably 10 mol % solute/90 mol % melting solvent to 60 mol % solute/40 mol % melting solvent.

If the solute is less than 10 mol %, the gradient of a liquid phase line in a pseudo-binary system phase diagram is so steep that the concentration of the melt greatly changes with growth of the film to make it difficult to stably keep the film-forming condition constant. If the solute is more than 60 mol %, the saturation temperature of the charging composition is so high that the film-forming temperature becomes so elevated as to make it difficult to form a single crystal film having good crystallinity.

In the present invention, it is preferable that a single crystal film of lithium tantalate is first formed on a substrate of a lithium niobate single crystal, and then a single crystal film of lithium niobate is formed thereon. Japanese patent application Laid-open No. 2-259,608 discloses such an element itself. That is, a substrate produced by forming a film of a lithium tantalate single crystal on an original substrate of a lithium niobate single crystal is more superior to the lithium tantalate substrate itself in terms of thermal expansion and strength.

Furthermore, the present invention is preferably applied to a process and an apparatus described in Japanese patent application Laid-open No. 2-88,430 in which a melt is obtained by mixing, heating and melting yttrium oxide, gadolinium oxide, bismuth oxide, iron oxide, lead oxide, and/or boron oxide, and a film of a magnetic garnet single crystal is formed on a substrate of a single crystal made of gadolium-garim-garnet replaced by calcium, magnesium and/or zirconium from the melt by the liquid phase epitaxial process.

(EXPERIMENTS)

In the following, experimental results will be explained.

(Experiment 1)

A substrate of a single crystal made of lithium niobate was used as an oxide type single crystal substrate. In this experiment, the producing apparatus shown in FIGS. 3 through 6 was used, and the temperature schedule shown in FIG. 7 was employed.

A pseudo-binary system of $LiNbO_3$-$LiVO_3$, 40 mol % $LiNbO_3$-60 mol % $LiVO_3$ was employed as a charging composition for a melt, and the liquid phase epitaxial process was carried out according to the temperature schedule shown in FIG. 7. The melt was stirred at a sufficiently high temperature $T_2$ (1100° C.) for 2 hours to obtain a sufficiently uniform liquid phase.

Thereafter, after the melt was cooled to around $T_3$: 950° C., the melt 3 was kept at this temperature for two hours, then cooled to $T_4$: 920° C. and held at this temperature for 2 hours. Next, the melt was cooled to 915° C., and the substrate 3 was contacted with the surface of the substrate 3. This state was kept for 30 minutes to effect the liquid phase epitaxial growth. At that time, a film of $LiNbO_3$ was epitaxially grown in a thickness of about 30 μm in the liquid phase. Next, the melt was heated to $T_5$ (1000° C.) in 15 minutes, and kept at this temperature for two hours.

On the other hand, the substrate 3 was placed inside the second furnace 24, heated from room temperature to 920° C., and brought into contact with the melt for 30 minutes as mentioned above. Immediately thereafter, the substrate was returned into the second furnace where the substrate was cooled to room temperature. The substrate was taken out from the second furnace. Whether the substrate was cracked or not was checked, and a half-width value of an X-ray rocking curve of the lithium niobate single crystal film was measured.

The half-width value of the X-ray rocking curve will be explained. The crystallinity of the single crystal substrate and the single crystal film can be evaluated based on the half-width value of the X-ray rocking curve. It can be judged that the smaller the half-width value of the X-ray rocking curve, the more better the crystallinity of the single crystal. Since the absolute half-width value itself varies depending up a reference crystal, etc. used in an X-ray measuring apparatus, the absolute half-width value cannot be specified.

However, the crystallinity of the single crystal thin film produced by the liquid phase epitaxial process is largely influenced by the crystallinity of the single crystal substrate. Therefore, whether the crystallinity of the produced single crystal film is good or not must be judged based on the half-width value of the X-ray rocking curve of the substrate used. Particularly, since the single crystal substrate of an optical grade is produced at present by a pull-up process, the half-width value of the X-ray rocking curve of the single crystal film is preferably smaller than that of the single crystal substrate of the optical grade.

All the half-width values of the X-ray rocking curves of the substances of lithium niobate single crystals having the optical grade used by the present invention were 6.98–6.9 arc·sec, and therefore such substrates were used as a standard for the crystallinity of the single crystal substrates of lithium niobate. The half-width value was measured based on the reflection at a (0012) face according to the double-crystal process. CuKα1 was used as incident X-rays, and a (422) face of a GaAs single crystal was used as a monochromator.

As a result, when a time period necessary for one cycle in which the substrate 3 was placed in the second furnace 21, heated to 920° C., contacted with the melt for 30 minutes, and cooled to room temperature in the second furnace was totally 4 hours, the substrate was not cracked, and the half-width value of the X-ray rocking curve was 5.8 arc·sec. When the time of one cycle was 5 hours, the substrate was not cracked, and the half-width value of the X-ray rocking curve value was 5.7 arc·sec. When the time of one cycle was 6 hours, the substrate was not cracked, and the half-width value of the X-ray rocking curve was 5.5 arc·sec.

(Comparative Experiment)

Figure 1:
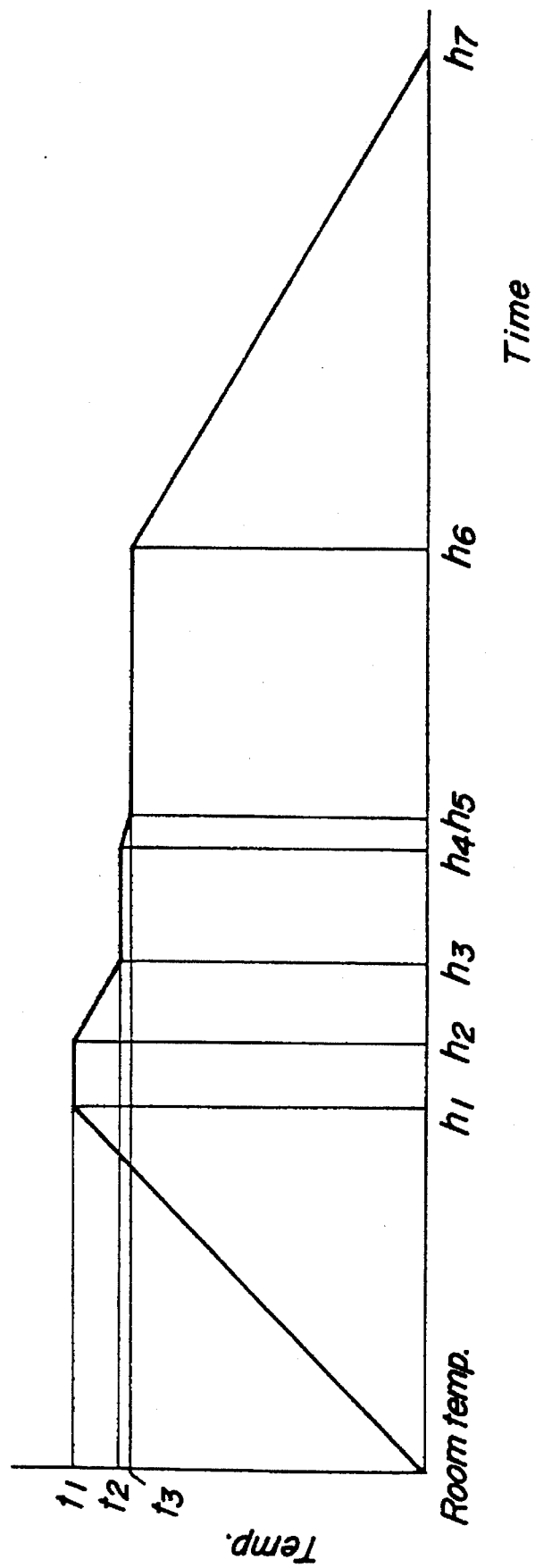
FIG. 1 is a graph for schematically illustrating a temperature schedule in the conventional liquid phase epitaxial process.
Figure 2:
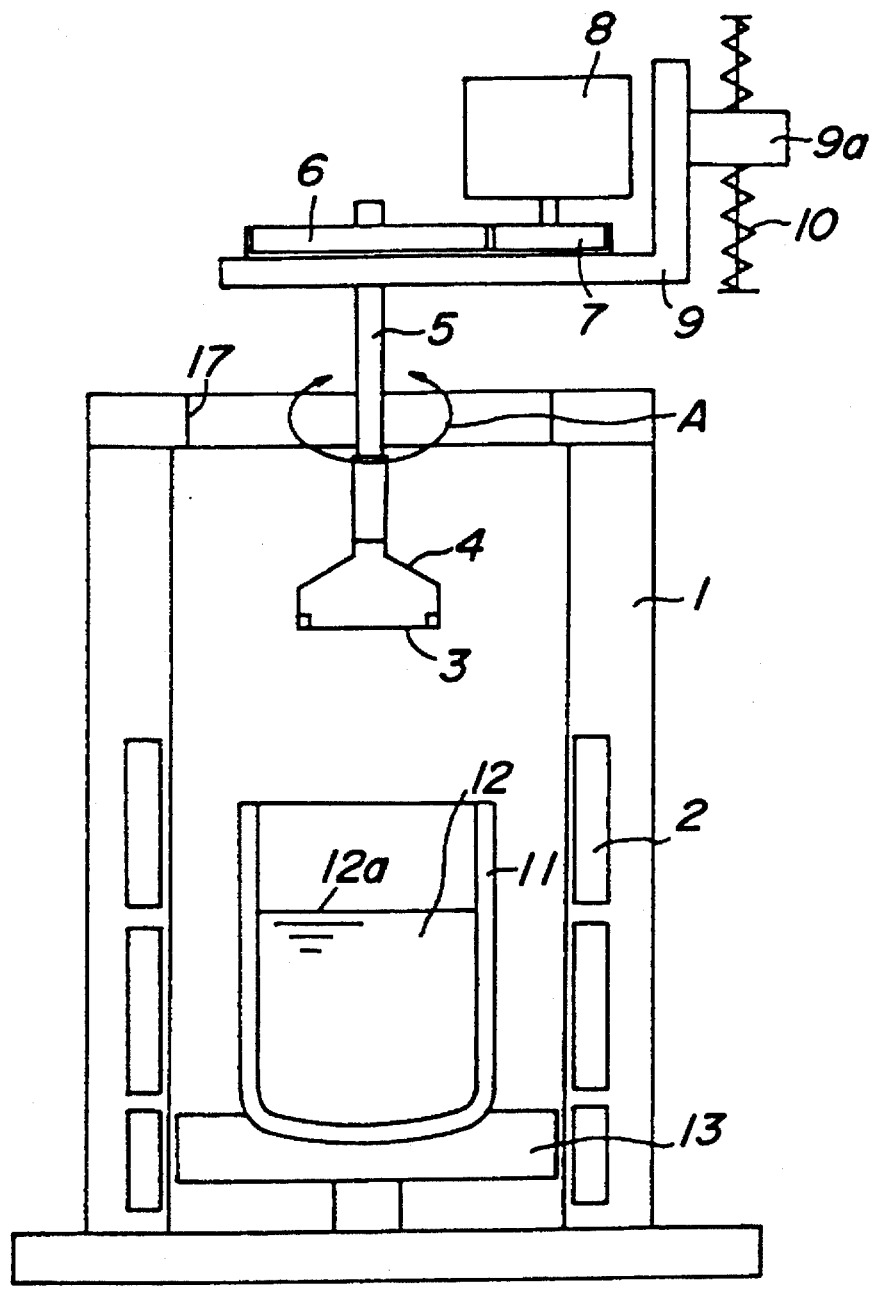
FIG. 2 is a diagrammatical view for schematically illustrating a conventional producing apparatus for practicing the liquid phase epitaxial process in the first furnace.

On the other hand, a film of a single crystal of lithium niobate was formed by using the temperature schedule and the apparatus shown in FIGS. 1 and 2. When a time necessary for one cycle in which a substrate 3 at room temperature was placed into the first furnace, gradually descended inside the first furnace, contacted with the melt at 920° C. for 30 minutes, then gradually ascended in the first furnace, and taken out of the first furnace was totally 15 hours, the substrate was cracked, and the half-width value of the X-ray rocking curve of the single crystal film was 6.9 arc·sec. When the time of one cycle was totally 20 hours, the substrate was not cracked, and the half-width value of the X-ray rocking curve of the single crystal was 6.3 arc·sec.

As mentioned above, according to the present invention, the substrate of the lithium niobate single crystal is not cracked, and the crystallinity of the single crystal is improved. In addition, the time period required for the formation of a given single crystal film of lithium niobate is remarkably shortened.

(Experiment 2)

An experiment was carried out similarly to Experiment 1. In this Experiment 2, a film of a magnetic garnet single crystal was formed on a substrate of a single crystal made of gadorinium-garium-garnet replaced by calcium, magnesium and/or zirconium according to the liquid phase epitaxial process from a melt obtained by mixing, heating and melting terbium oxide, bismuth oxide, iron oxide, lead oxide and/or boron oxide.

The melt was converted to a sufficiently uniform liquid phase by stirring at a sufficiently high temperature: $T_2$ (1000° C.) for 2 hours. Next, while the melt was cooled to 750° C., the substrate was contacted with the liquid surface of the melt. In this state, the substrate was kept contacted with the melt for 60 minutes to effect epitaxial growth in the liquid phase. Thereafter, the temperature of the melt was raised to $T_5$: 800° C. in 30 minutes, and kept at this temperature for 2 hours.

A film having a composition of $Tb_{2.6}Bi_{0.4}Fe_5O_{12}$ was grown in a thickness of about 100 μm.

On the other hand, the substrate 3 was placed into the second furnace 24, heated from room temperature to 750° C., contacted with the melt for 60 minutes as mentioned above, immediately returned into the second furnace, and cooled down to room temperature. Finally, the substrate was taken out from the second furnace. Whether the substrate 3 was cracked or not was confirmed, and the half-width value of the X-ray rocking curve was measured.

The half-width value was measured with respect to a (888) face according to a five-crystal process. CuKα1 was used as incident X-rays, and a (440) face of a Ge single crystal was used as a monocolor meter.

Since the half-width values of single crystal substrates of X-ray rocking curves of a single crystal made of gadolinium garium garnet substituted by calcium, magnesium and/or zirconium single crystal substrate were all 12.1 to 12.4 arc·sec, these were used as the standard of the crystallinity of the single crystal substrate.

In view of this, the time necessary for one cycle in which the substrate 3 was placed in the second furnace 24, heated to 750° C., contacted with the melt for 30 minutes, and then cooled to room temperature inside the second furnace was totally 4 hours, the substrate was not cracked, and the half-width value of the X-ray rocking curve was 10.5 arc·sec. When the time of one cycle was totally 5 hours, the substrate was not cracked, and the half-width value of the X-ray rocking curve of the single crystal was 10.7 arc·sec. When the time of one cycle was totally 6 hours, the substrate was not cracked, and the half-width value of the X-ray rocking curve of the single crystal was 11.0 arc·sec.

(Comparative Experiment 2)

On the other hand, a film of a single crystal of magnetic garnet was formed similarly to Experiment 2 by using the temperature schedule and the apparatus shown in FIGS. 1 and 2. When a time necessary for one cycle in which a substrate 3 at room temperature was placed into the first furnace, gradually descended inside the first furnace, contacted with the melt at 750° C. for 30 minutes, then gradually ascended in the first furnace, and taken out of the first furnace was totally 10 hours, the substrate was cracked, and the half-width value of the X-ray rocking curve of the single crystal film was 11.8 arc·sec. When the time of one cycle was totally 15 hours, the substrate was not cracked, and the half-width value of the X-ray rocking curve of the single crystal was 11.3 arc·sec.

As mentioned above, according to the present invention, when the film of the oxide type single crystal is to be formed on the substrate of such an oxide type single crystal according to the liquid phase epitaxial process, the substrate can be prevented from being cracked, and the productivity of the film of the oxide type single crystal can be enhanced. In addition, the crystallinity of the oxide type single crystal film can be improved.

What is claimed is:

1. A process for forming a plurality of successively laminated single crystal oxide films on a single crystal oxide substrate, comprising the steps of:

providing a plurality of first furnaces each holding a respective supercooled melt, and a second furnace separated from the first furnaces;

holding the substrate in the second furnace, wherein the temperature of the substrate is adjusted; and successively contacting the substrate with the melts in the first furnaces, thereby successively laminating single crystal oxide films on the substrate by epitaxial growth.

2. The process of claim 1, wherein the substrate is successively contacted with the melts after preheating in the second furnace.

3. The process of claim 1, wherein the substrate is cooled in the second furnace after forming the films on the substrate.

4. The process of claim 2, wherein the substrate is cooled in the second furnace after forming the films on the substrate.

5. The process of claim 1, wherein the films are formed on a main surface of the substrate.

6. The process of claim 1, further comprising the consecutive steps of:

holding the melts in a first unsaturated state in the first furnaces;

supercooling the melts to a first supercooled state;

contacting the substrate with the melts in the first supercooled state;

moving the substrate to the second furnace;

raising the temperatures of the melts to a second unsaturated state;

supercooling the melts to a second supercooled state; and providing another single crystal oxide substrate for contacting the melts in the second supercooled state.

7. The process of claim 3, wherein a plurality of second furnaces are provided and while said films are laminated on said substrate in the first furnaces, another substrate is heated and a further substrate is cooled in respective second furnaces.

8. The process of claim 1, wherein said second furnace comprises a tunnel furnace having a given temperature schedule in a length direction thereof, and the temperature of the substrate is adjusted in the tunnel furnace while being transferred therethrough.

9. The process of claim 1, wherein said substrate comprises a ferroelectric material.

10. The process of claim 5, wherein said substrate comprises a ferroelectric material.

11. The process of claim 6, wherein said substrate comprises a ferroelectric material.

12. The process of claim 7, wherein said substrate comprises a ferroelectric material.

13. The process of claim 8, wherein said substrate comprises a ferroelectric material.

14. An apparatus for producing a plurality of successively laminated single crystal oxide films on a single crystal oxide substrate, comprising:

a plurality of first furnaces each holding a respective supercooled melt;

a second furnace separated from the first furnaces, said second furnace being adapted to adjust the temperature of the substrate; and moving means for moving said substrate (i) among the first furnaces to epitaxially grow a plurality of single crystal oxide films on the substrate by contacting the supercooled melts in the first furnaces, and (ii) between the second furnace and the first furnaces.

15. The apparatus of claim 14, further comprising a movable partition wall for separating the second furnace from the first furnaces, and a driving unit for moving the first and second furnaces relative to each other.

16. The apparatus of claim 15, wherein said second furnace is adapted to be in open communication with each of the first furnaces by moving the partition wall and moving the first and second furnaces relative to each other.

17. The apparatus of claim 15, wherein each of the first furnaces is adapted to be received in the second furnace.

18. The apparatus of claim 14, further comprising a rotatable crucible for holding each respective melt.

19. The apparatus of claim 14, further comprising a plurality of second furnaces for each of the first furnaces.

20. The apparatus of claim 14, wherein said second furnace is a tunnel furnace that provides a given temperature schedule along a length thereof, whereby the temperature of the substrate is adjusted while being transferred through the tunnel furnace.

* * * * *